US007036220B2

(12) United States Patent
Davidson et al.

(10) Patent No.: US 7,036,220 B2
(45) Date of Patent: May 2, 2006

(54) PIN-DEPOSITION OF CONDUCTIVE INKS FOR MICROELECTRODES AND CONTACT VIA FILLING

(75) Inventors: J. Courtney Davidson, Livermore, CA (US); Peter A. Krulevitch, Pleasanton, CA (US); Mariam N. Maghribi, Livermore, CA (US); Julie K. Hamilton, Tracy, CA (US); William J. Benett, Livermore, CA (US); Armando R. Tovar, San Antonio, TX (US)

(73) Assignee: The Regents of the University of California, Oakland, CA (US)

( * ) Notice: Subject to any disclaimer, the term of this patent is extended or adjusted under 35 U.S.C. 154(b) by 214 days.

(21) Appl. No.: 10/742,112

(22) Filed: Dec. 18, 2003

(65) Prior Publication Data

US 2005/0136639 A1    Jun. 23, 2005

(51) Int. Cl.
*H05K 3/10* (2006.01)
(52) U.S. Cl. ...................................................... 29/846
(58) Field of Classification Search ................ 438/612; 29/846
See application file for complete search history.

(56) References Cited

U.S. PATENT DOCUMENTS

| 3,301,175 | A | * | 1/1967 | Polichette | ................... | 101/41 |
|---|---|---|---|---|---|---|
| 3,576,669 | A | * | 4/1971 | Filip | .......................... | 427/96.9 |
| 4,485,387 | A | * | 11/1984 | Drumheller | .............. | 346/140.1 |
| 4,519,760 | A | * | 5/1985 | Norell | ......................... | 425/113 |
| 5,490,428 | A | | 2/1996 | Durr | | |
| 6,103,033 | A | * | 8/2000 | Say et al. | ................... | 156/73.1 |
| 6,413,790 | B1 | | 7/2002 | Duthaler et al. | | |
| 6,596,569 | B1 | | 7/2003 | Bao et al. | | |
| 6,697,694 | B1 | * | 2/2004 | Mogensen | ................... | 700/119 |
| 6,878,643 | B1 | * | 4/2005 | Krulevitch et al. | ......... | 438/780 |
| 2003/0029831 | A1 | | 2/2003 | Kawase | | |
| 2003/0097166 | A1 | | 5/2003 | Krulevitch et al. | | |
| 2004/0018297 | A1 | * | 1/2004 | Davidson et al. | .............. | 427/58 |
| 2004/0094835 | A1 | * | 5/2004 | Maghribi et al. | ............ | 257/734 |
| 2004/0121528 | A1 | * | 6/2004 | Krulevitch et al. | ......... | 438/166 |
| 2004/0209396 | A1 | * | 10/2004 | Krulevitch et al. | ......... | 438/106 |
| 2004/0243204 | A1 | * | 12/2004 | Maghribi et al. | ........... | 607/115 |
| 2004/0262582 | A1 | * | 12/2004 | Kirkor et al. | ............... | 252/500 |
| 2005/0035983 | A1 | * | 2/2005 | Cruchon-Dupeyrat et al. | ... | 346/140.1 |

* cited by examiner

*Primary Examiner*—Evan Pert
(74) *Attorney, Agent, or Firm*—Eddie E. Scott; Alan H. Thompson

(57) ABSTRACT

A method of metalization of an integrated microsystem. The method comprises providing a substrate and applying a conductive material to the substrate by taking up small aliquots of conductive material and releasing the conductive material onto the substrate to produce a circuit component.

18 Claims, 3 Drawing Sheets

PIN-DEPOSITION OF CONDUCTIVE INKS FOR MICROELECTRODES AND CONTACT VIA FILLING

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to electronics and more particularly to metalization in integrated microsystems.

2. State of Technology

U.S. Pat. No. 5,817,550 for a method for formation of thin film transistors on plastic substrates to Paul G. Carey, Patrick M. Smith, Thomas W. Sigmon, and Randy C. Aceves, issued Oct. 6, 1998 and assigned to Regents of the University of California provides the following state of technology information, "Recently a process was developed for crystallizing and doping amorphous silicon on a low cost, so-called low-temperature plastic substrate using a short pulsed high energy source in a selected environment, without heat propagation and build-up in the substrate so as to enable use of plastic substrates incapable of withstanding sustained processing temperatures higher than about 180 degree C. Such a process is described and claimed in U.S. Pat. No. 5,346,850 issued Sep. 13, 1994 to J. L. Kaschmitter et al., assigned to the Assignee of the instant application. Also, recent efforts to utilize less expensive and lower temperature substrates have been carried out wherein the devices were formed using conventional temperatures on a sacrificial substrate and then transferred to another substrate, with the sacrificial substrate thereafter removed. Such approaches are described and claimed in U.S. Pat. No. 5,395,481 issued Mar. 7, 1995, U.S. Pat. No. 5,399,231 issued Mar. 21, 1995, and U.S. Pat. No. 5,414,276 issued May 9, 1995, each issued to A. McCarthy and assigned to the assignee of the instant application."

U.S. Patent Application No. 2003/0097166 by Peter Krulevitch, Dennis L. Polla, Mariam Maghribi, and Julie Hamilton, for a flexible electrode array for artificial vision, published May 22, 2003, provides the following state of the technology information, "The system uses a substrate with embedded electrodes and conductive leads for directly stimulating cells. The electrode array system can conform to various shapes. The electrode array has many uses. For example the electrode array system of the present invention provides an artificial vision system. The electrode array system of the present invention can provide an electrode array that is implantable and can be used for surgical insertion. Also, the electrode array system of the present invention can provide an electrode array that can be attached to the surface of the skin. The electrode array system of the present invention can provide an electrode array that can be used in other ways. Other applications of the electrode array system of the present invention include use of the electrode array as a flex circuit."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a system for metalization of an integrated microsystem. The system comprises providing a substrate and applying a conductive material to the substrate by taking up small aliquots of conductive material and releasing the conductive material onto the substrate to produce a circuit component. In one embodiment the circuit component is a metal electrode. In another embodiment the circuit component is a via for multilevel metallization. In one embodiment the conductive material comprises conductive ink. In another embodiment the conductive material comprises electrode metal. In one embodiment the step of applying a conductive material to the substrate is accomplished using a precision pin tip to take up small aliquots of conductive material, positioning the pin tip over the substrate, and releasing the conductive material onto the substrate to produce the circuit component.

One embodiment of the present invention provides a system for metalization of an integrated polymer microsystem. The system comprises providing a flexible polymer substrate and applying a conductive material to the flexible polymer substrate by taking up small aliquots of conductive material and releasing the conductive material onto the flexible polymer substrate to produce a circuit component. In one embodiment the circuit component is a metal electrode. In another embodiment the circuit component is a via for multilevel metallization. In one embodiment the conductive material comprises conductive ink. In another embodiment the conductive material comprises electrode metal. In one embodiment the step of applying a conductive material to the flexible polymer substrate is accomplished using a precision pin tip to take up conductive ink or electrode metal, positioning the pin tip over the flexible polymer substrate, and releasing the conductive ink or electrode metal onto the flexible polymer substrate.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
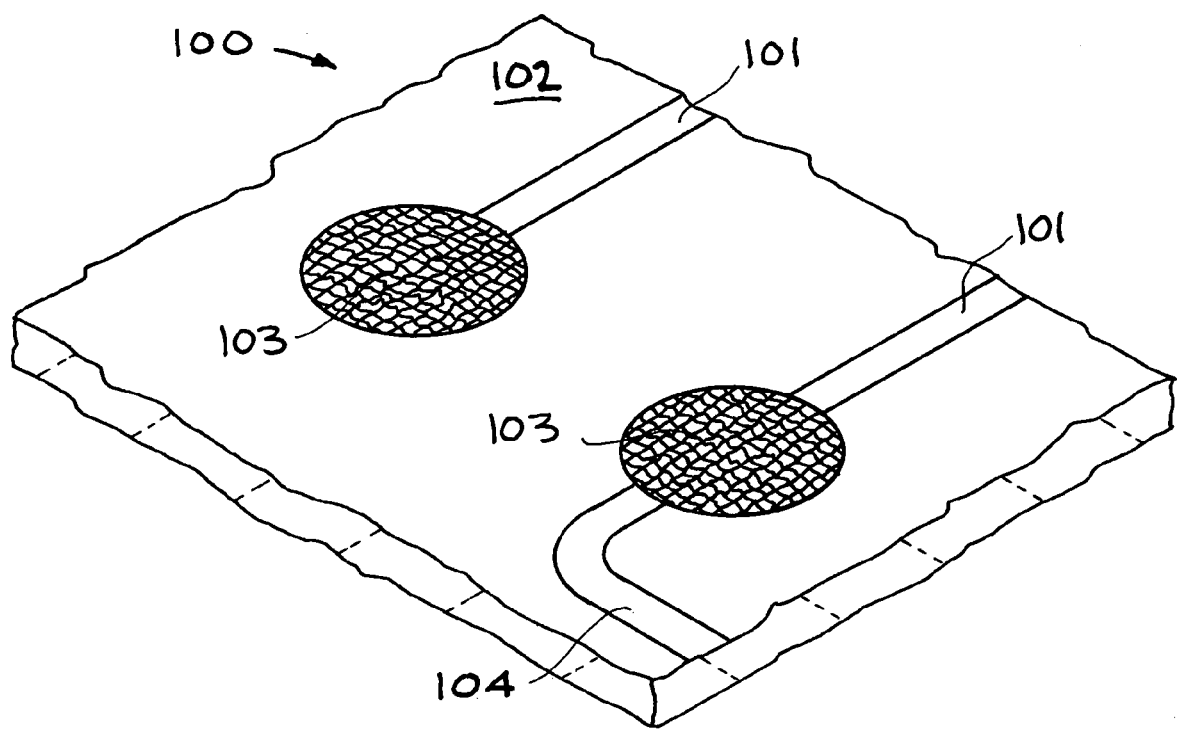
FIG. 1 illustrates a circuit board produced by a system for producing metal electrodes or for filling vias for multilevel metallization.

Referring now to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

The present invention provides a system for metalization of an integrated microsystem. The system comprises providing a substrate and applying a conductive material to the substrate by taking up small aliquots of conductive material and releasing the conductive material onto the substrate to produce a circuit component. In one embodiment the circuit component is a metal electrode. In another embodiment the circuit component is a via for multilevel metallization. In one embodiment the conductive material comprises conductive ink. In another embodiment the conductive material comprises electrode metal. In one embodiment the step of applying a conductive material to the substrate is accomplished using a precision pin tip to take up small aliquots of conductive material, positioning the pin tip over the substrate, and releasing the conductive material onto the substrate to produce the circuit component.

One embodiment of the present invention provides a system for metalization of an integrated polymer microsystem. The system comprises providing a flexible polymer substrate and applying a conductive material to the flexible polymer substrate by taking up small aliquots of conductive material and releasing the conductive material onto the flexible polymer substrate to produce a circuit component. In one embodiment the circuit component is a metal electrode. In another embodiment the circuit component is a via for multilevel metallization. In one embodiment the conductive material comprises conductive ink. In another embodiment the conductive material comprises electrode metal. In one embodiment the step of applying a conductive material to the flexible polymer substrate is accomplished using a precision pin tip to take up conductive ink or electrode metal, positioning the pin tip over the flexible polymer substrate, and releasing the conductive ink or electrode metal onto the flexible polymer substrate.

Referring now to FIG. 1, an embodiment of a system for producing metal electrodes and for filling vias for multilevel metalization in accordance with the present invention is illustrated. The circuit board produced by the system is designated generally by the reference numeral 100.

In the system for producing the circuit board 100, an electronic circuit 101 is integrated into a polymer substrate 102. The electronic circuit 101 is a passivated gold trace. Circuit interconnects 103, in the form of metal electrodes, are provided. The system for producing the circuit board 100 can also be used filling vias for multilevel metalization. The metal electrodes 103 are produced by precision pin tips used to first take up small aliquots of conductive ink or electrode metal. The metal electrodes shown in FIG. 1 are pin deposited silver electrode metal.

The substrate 102 in the circuit board 100 comprises a silicone, poly(dimethylsiloxane) (PDMS) substrate that serves as a platform for integrating and packaging the individual components. Applicants have demonstrated selective passivation of metal traces with silicone exposing the traces only in areas needed to complete the electronic device. The system for producing the circuit board 100 provides metalizing silicone, selective passivation, using batch fabrication photolithographic techniques, to fabricate silicone, and produces stretchable metal traces that are capable of withstanding strains of 7%.

In the first step a silicone layer is provided on a matrix. The matrix provides a temporary base for production of the electronic devices. The matrix can be a mold, a handle wafer, or other base for producing the electronic device. In some embodiments the matrix can form part of the finished electronic device. A specific matrix for the system 100 is a silicon handle wafer. Silicon wafers are convenient for the handle material because they are flat, stable, routinely used in microfabrication applications, and they are readily available. Materials such as glass, plastic, or ceramic can also be used. Silicone is spun onto the wafer at a desired thickness and cured. For example, the silicone may be cured at 66° C. for 24–48 hours. Silicone has very low water permeability and protects the electronic components from the environment. The silicone is flexible and will conform to curved surfaces. It is transparent, stretchable, resinous, rubbery, stable in high temperatures and provides numerous electronic devices.

The next step of the process is forming the electrical circuit lines. A photoresist (AZ®1518, Clariant) is spun onto the silicone membrane surface at 1000 rpm for 20 seconds and baked at 60° C. for 20 minutes. The temperature is brought down slowly (30 min. to ramp temperature down) to room temperature to avoid cracking in the photoresist. Prior to photoresist application, the wafer is placed in an oxygen plasma to activate the surface. This allows the resist to wet the silicone surface preventing beading and ensuring the formation of a smooth and uniform coat of photoresist on the polymer surface. The substrate is placed in the oxygen plasma for 1 minute at an RF power of 100 Watts with oxygen flowing at 300 sccm. The photoresist features are then UV exposed at 279 mJ and developed in AZ developer mixed 1:1 with water for 70 sec. Then the wafer is rinsed under a gentle stream of water and dried using $N_2$. The wafer is placed for a second time in the oxygen plasma to activate the newly exposed silicone surface, and promote adhesion of the metal, which is deposited in the next step.

In step 103 a 150 nm gold film is e-beam evaporated or sputtered onto the wafer using titanium as the adhesion layer. The e-beam needs to be sufficiently cooled down before removing the parts. Cool down is conducted for 10 min. under vacuum and for 20 min. with the system vented, but not open. The metal adheres to the silicone surface in regions where the photoresist was removed, and the excess metal is removed through a lift-off process by placing the wafer in acetone. The wafer is then prepared for the next step by rinsing with ethanol and drying gently. If the silicone surface is contaminated or aged, it can be refreshed by soaking in a 20% solution of HCl for 8 min.

The system for producing the circuitboard 100 has a wide variety of uses. For example, the system for producing the circuit board 100 provides implantable, biocompatible microelectrodes; via contact metalization in polymer-based multilevel metal integrated systems, and applications requiring electrodes with enhanced surface charge carrying capacity. Parallel extension and automation of the system for producing the circuit board 100 can be used for high throughput microelectrode fabrication and polymer based hybrid systems fabrication. The system for producing the circuit board 100 can provide a wide variety of electronic devices. Examples of some of the electronic devices that can be constructed using the system for producing the circuit board 100 include the following: electrode array, implantable medical device, radio, recorder, recorder and player, video camera, video player, video recorder, video recorder and player, cell phone, computer, calculator, phone tap, gadget that detects phone taps, audio surveillance device, medical device, biosensor, radiation monitor, power source, battery, solar cell, wireless electronics for communication, capacitor, resistor, inductor, transformer, light-emitting diode, optical detector, optical encoder, integrated circuit, microprocessor, digital to analog converter, display, camera, cell phone, and other electronic devices. Devices are attached to an activated flexible polymer substrate. In the case of PDMS substrates both the substrate and the device passivating oxide are cleaned in ethanol prior to an oxygen plasma. Devices are then permanently bonded to the substrate upon contact. The electronic units are connected by conductive lines 104. The system for producing the circuit board 100 has uses that include implantable, biocompatible microelectrodes; via contact metalization in polymer-based multilevel metal integrated systems; applications requiring electrodes with enhanced surface charge carrying capacity. Parallel extension and automation of this method can be used for high throughput microelectrode fabrication and polymer based hybrid systems fabrication.

As illustrated by FIG. 1, precision pin tips are used to first take up small aliquots of conductive ink. (The volume of ink deposited is on the order of nanoliters.) A micromanipulator is then used to position the pin tip over prefabricated holes (vias) that allow contact to insulated (passivated) metal traces. The pin is then lowered until the ink droplet contact the bottom of the via at which point a set volume of ink is release thus filling the contact via. Different sized vias can be filled using a variety of pin sizes or by making multiple deposition passes.

Figure 2:
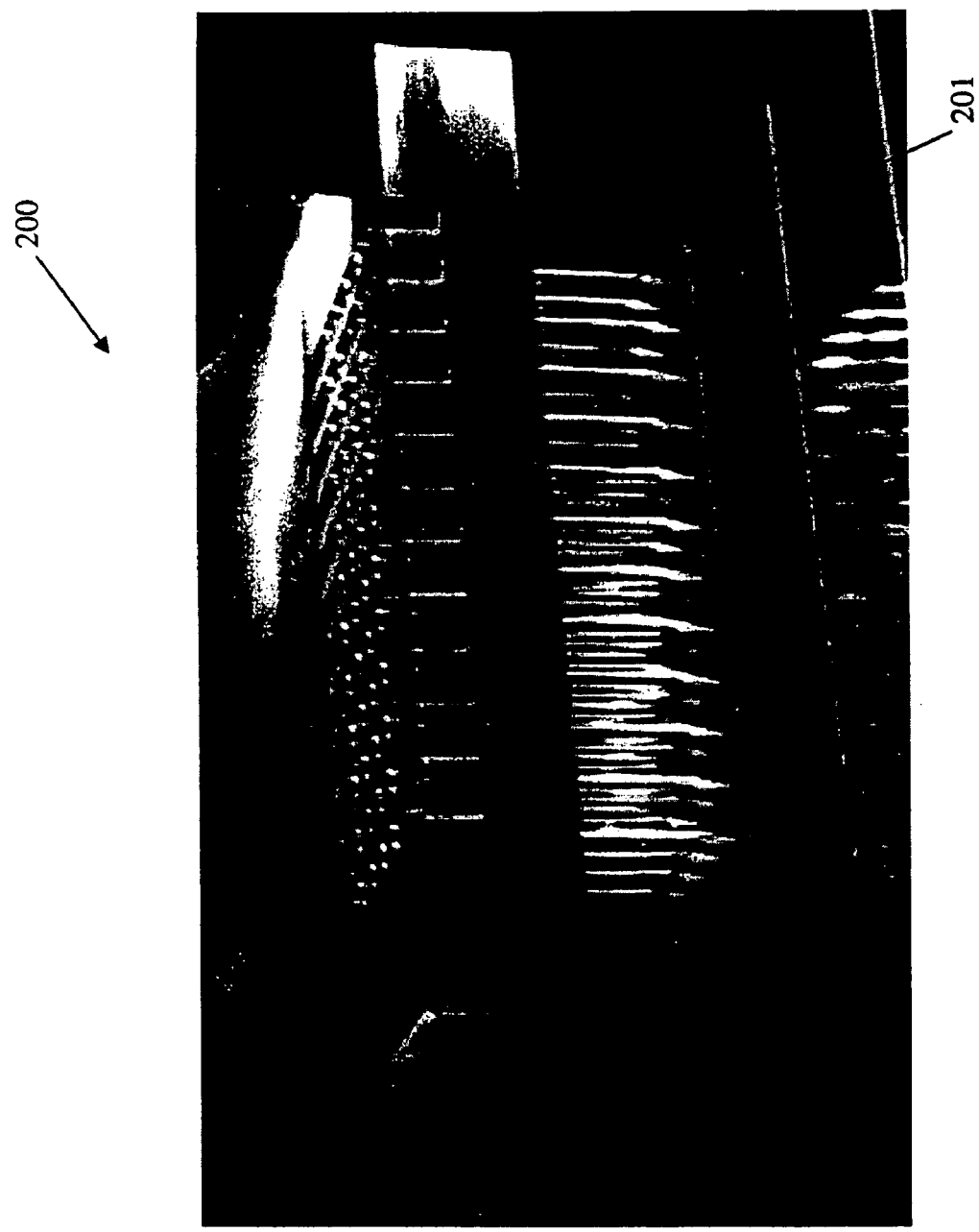
FIG. 2 illustrates a micromanipulator 200 used to position the pin tips over prefabricated holes or vias that allow contact to insulated metal traces.

Referring now to FIG. 2, a micromanipulator 200 is shown that is used to position the pin tips 201 over prefabricated holes or vias that allow contact to insulated (passivated) metal traces. The micromanipulator 200 is a contact-based microarrayer that uses pins to spot conductive material on the substrate. The micromanipulator 200 can be obtained from a number of microarrayer manufacturers. For example, Sunnyvale, California based TeleChem International produce a Stealth Micro Spotting Device. It includes stainless steel pins 201 that contain chambers that collect a user-specified, set volume of 0.1–1.0 µL when dipped into a liquid sample. Stealth pins have flat tips with customizable widths to deliver spots with diameters of 50–300 µm. Direct contact between the liquid and a solid surface results in drop deposition. This technology enables multiple prints per load and is flexible, in that both the number of pins as well as the spot sizes can be varied. The micromanipulator 200 can be obtained from TeleChem International, Inc., 524 East Weddell Drive, Sunnyvale, Calif. 94089.

Figure 3:
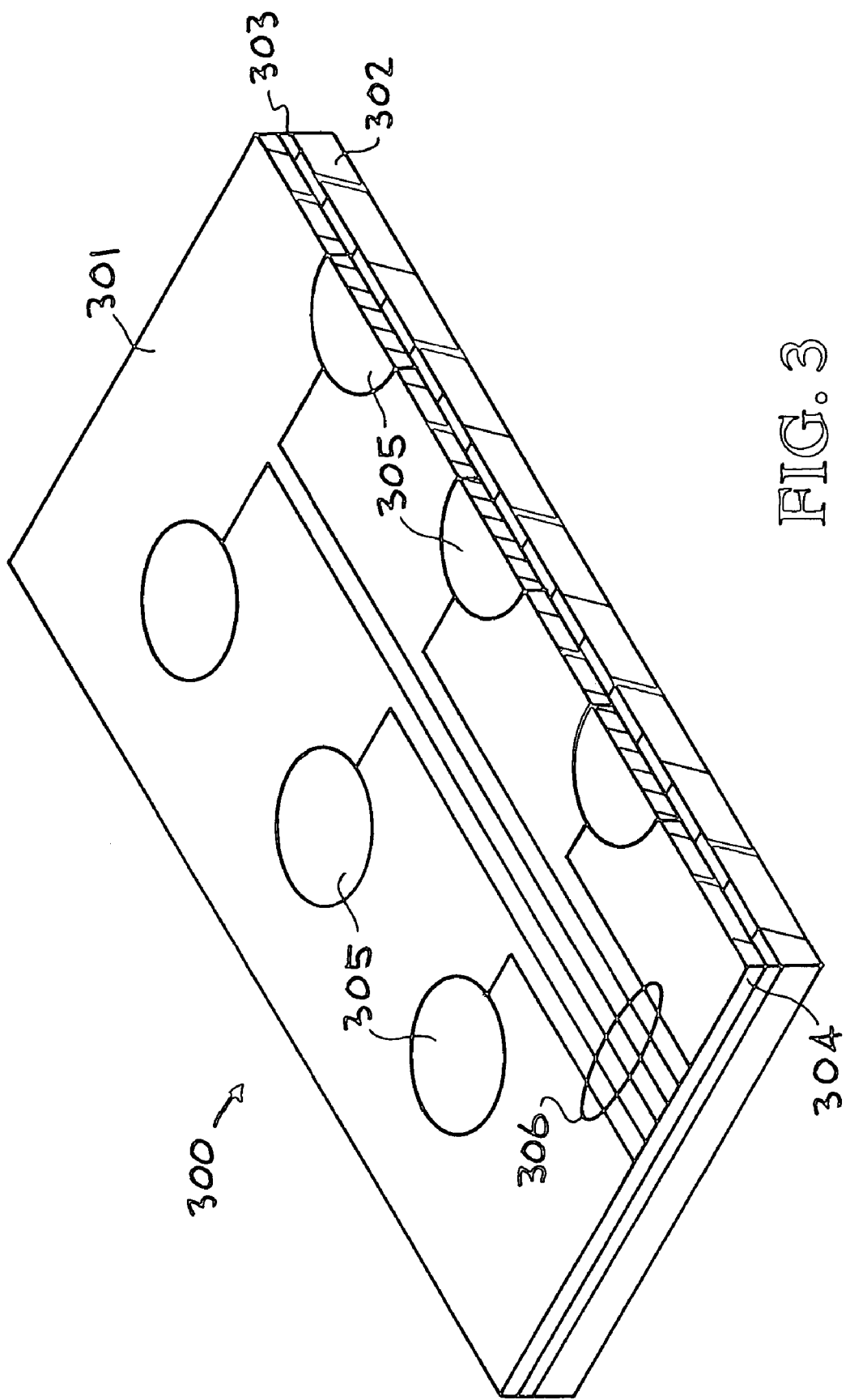
FIG. 3 illustrates another embodiment of the present invention.

Referring now to FIG. 3, another embodiment of the present invention is illustrated. The embodiment is designated generally by the reference numeral 300. A device 301 is fabricated by the method of the present invention that produces a polymer substrate 302 that has the ability to conform to various shapes of tissue. An electroplating seed layer 303 is deposited onto handle wafer that forms the polymer substrate 302. A patterned photoresist is produced. A polymer 304 is spun or cast onto the patterned photoresist on the handle wafer that forms the polymer substrate 302. The remaining photoresist is removed resulting in patterned PDMS on top of the handle wafer. Holes 305 in the polymer 304 provide sections of the underlying seed layer exposed. Gold, platinum, or other conductive material is deposited in accordance with the present invention in the holes 305 to form electrodes. Conductive metal lines 306 are patterned to provide circuit connections from the electrodes. A micromanipulator is used to position the pin tips over the prefabricated holes 305 that allow contact to the metal traces 306. The micromanipulator is a contact-based microarrayer that uses pins to spot conductive material on the substrate.

In one embodiment the device is biocompatable. In another embodiment the device is implantable. In one embodiment the polymer is an elastomer. In another embodiment the polymer is an elastomer that is conformable. In another embodiment the polymer is an elastomer that is flexible and stretchable. In another embodiment the elastomer is poly(dimethylsiloxane).

The embodiment 300 can be used to produce electronic devices. Examples of electronic devices that can be produced include but are not limited to the following: implantable devices including epiretinal, subretinal, and cortical artificial vision implants; cochlear implants, neurological implants, spinal cord implants, and other neural interface implants; implantable and transdermal drug delivery devices; monitoring devices; implantable electrode arrays including arrays for deep brain stimulation, spinal cord reattachment, nerve regeneration, cortical implants, retinal implants, and cochlear implants; drug delivery, muscle stimulation and relaxation, flexible displays, smart notes, conformable circuits, sensors, radios, recorders, cameras, cell phones, computers, calculators, surveillance devices, medical devices, radiation monitors, biological and biomedical devices, and other devices. The embodiment 300 can also be used to produce electronic components including, but not limited to, power sources, batteries, solar cells, wireless electronics for communication, capacitors, resistors, inductors, transformers, integrated circuits, microprocessors, digital to analog converters, displays, and other components.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A method of metalization in an integrated microsystem, comprising the steps of:
   providing a poly(dimethylsiloxane) substrate,
   forming at least one conducting line in said poly(dimethylsiloxane) substrate,
   forming at least one hole in said poly(dimethylsiloxane) substrate with said hole connected to said at least one conducting line, and applying a conductive material to said at least one hole in said poly(dimethylsiloxane) substrate by taking up at least one aliquot of conductive material and releasing said conductive material into said at least one hole in said poly(dimethylsiloxane) substrate to produce a circuit component.

2. The method of metalization of claim 1 wherein said circuit component is a metal electrode.

3. The method of metalization of claim 1 wherein said circuit component is a via for multilevel metallization.

4. The method of metalization of claim 1 wherein said conductive material comprises conductive ink.

5. The method of metalization of claim 1 wherein said conductive material comprises electrode metal.

6. The method of metalization of claim 1 wherein said step of applying a conductive material to said substrate is accomplished using a precision pin tip to take up at least one aliquot of conductive material, positioning said pin tip over said substrate, and releasing said conductive material into said at least one hole in said poly(dimethylsiloxane) substrate to produce said circuit component.

7. The method of metalization of claim 6 wherein said circuit component is a metal electrode.

8. The method of metalization of claim 6 wherein said circuit component is a via for multilevel metallization.

9. The method of metalization of claim 6 wherein said conductive material comprises conductive ink.

10. The method of metalization of claim 6 wherein said conductive material comprises electrode metal.

11. The method of metalization of claim 1 wherein said step of applying a conductive material to said substrate is accomplished using a precision pin tip to take up at least one aliquot of conductive ink or electrode metal, positioning said pin tip over said substrate, and releasing said conductive ink or electrode metal into said at least one hole in said poly(dimethylsiloxane) substrate to produce a metal electrode or fill a via for multilevel metallization.

12. A method of metalization in an integrated polymer microsystem, comprising the steps of:
    providing a flexible poly(dimethylsiloxane) substrate,
    forming at least one conducting line in said flexible poly(dimethylsiloxane) substrate,
    forming at least one hole in said flexible poly(dimethylsiloxane) substrate with said hole connected to said at least one conducting line, and
    applying a conductive material to said at least one hole in said flexible poly(dimethylsiloxane) substrate by taking up at least one aliquot of conductive material and releasing said conductive material into said at least one hole in said flexible poly(dimethylsiloxane) substrate to produce a circuit component.

13. The method of metalization of claim 12 wherein said circuit component is a metal electrode.

14. The method of metalization of claim 12 wherein said circuit component is a via for multilevel metallization.

15. The method of metalization of claim 12 wherein said conductive material comprises conductive ink.

16. The method of metalization of claim 12 wherein said conductive material comprises electrode metal.

17. The method of metalization of claim 16 wherein said step of applying a conductive material to said flexible poly(dimethylsiloxane) substrate is accomplished using a precision pin tip to take up at least one aliquot of conductive ink or electrode metal, positioning said pin tip over said flexible poly(dimethylsiloxane) substrate, and releasing said conductive ink or electrode metal into said at least one hole in said flexible poly(dimethylsiloxane) substrate.

18. The method of metalization of claim 17 wherein said step of applying a conductive material to said flexible poly(dimethylsiloxane) substrate includes producing three-dimensional microfluidic channels in said flexible poly(dimethylsiloxane) substrate and filling said three-dimensional microfluidic channels with conductive ink.

* * * * *